United States Patent [19]

Kim et al.

[11] Patent Number: 4,910,518
[45] Date of Patent: Mar. 20, 1990

[54] COMPARATOR UNIT FOR A FLASH ANALOG-TO-DIGITAL CONVERTER

[75] Inventors: Heung-Suck Kim, Incheon-city; Chan-Kyu Myung, Seoul, both of Rep. of Korea

[73] Assignee: Samsun Semiconductor and Telecommunications Co., Ltd., Gumi-City, Rep. of Korea

[21] Appl. No.: 218,843

[22] Filed: Jul. 14, 1988

[30] Foreign Application Priority Data

Jul. 16, 1987 [KR] Rep. of Korea .................... 87-11659

[51] Int. Cl.[4] ............................................. H03M 1/00
[52] U.S. Cl. ................................... 341/155; 341/143; 341/160; 330/254
[58] Field of Search ............... 341/120, 139, 140, 155, 341/160; 330/310, 254, 258

[56] References Cited

U.S. PATENT DOCUMENTS

| 4,379,995 | 4/1983 | Yamada et al. | 330/254 |
| 4,390,848 | 6/1983 | Blauschild | 330/254 |
| 4,396,891 | 8/1983 | Johansson et al. | 330/254 |
| 4,599,599 | 7/1986 | Sekino et al. | 341/160 |
| 4,692,641 | 9/1987 | Highton | 341/100 |
| 4,777,472 | 10/1988 | Sauer et al. | 341/143 |
| 4,804,941 | 2/1989 | Yoshii | 341/155 |

*Primary Examiner*—William M. Shoop, Jr.
*Assistant Examiner*—Helen Kim
*Attorney, Agent, or Firm*—Cushman, Darby & Cushman

[57] ABSTRACT

A high speed comparator unit for a flash A/D converter in which a bank of comparator units compare simultaneously an analog input voltage with equally spaced reference voltages, and an encoder ROM produces digital signals based on the comparator unit's outputs. The comparator unit includes a two-stage cascode configuration and a level shifter configuration which effectively reduces the miller-effect of the comparator unit.

7 Claims, 3 Drawing Sheets

COMPARATOR UNIT FOR A FLASH ANALOG-TO-DIGITAL CONVERTER

BACKGROUND OF THE INVENTION

1. Field of the Invention

The present invention relates to a comparator unit for a flash A/D converter in which a bank of comparator units compare simultaneously an analog input voltage with equally spaced reference voltages, and an encoder ROM produces digital signals based on the comparator unit's outputs. More particularly, the present invention relates to a high speed comparator unit including a miller-effect reducer which reduces the miller-effect of latch transistors to increase comparison speed.

2. Description of the Prior Art

The flash A/D converter is the fastest of all converter systems. Conversion speed is limited by the speed of a comparator unit.

As shown in FIG. 1 (PRIOR ART), a conventional flash A/D converter comprises a plurality of comparator units 5 for simultaneously comparing an analog input voltage $V_{in}$ with equally spaced referenced voltages $V_{ref}$. A voltage divider of resistors $R_{n1}, R_{n2}, \ldots R_{n2m}$ disposed between supply voltage $V_{TOP}$ and $V_{BTM}$ are connected to an inverting terminal (−) of each comparator $CP_1, CP_2, \ldots CP_{2m}$, and an analog input voltage $V_{in}$ is connected to a noninverting terminal (+) of each comparator $CP_1, CP_2, \ldots CP_{2m}$. Output terminals of the comparators $CP_1, CP_2, \ldots CP_{2m}$ are connected to encoder ROM 10 which converts the analog input voltage $V_{in}$ to a digital signal $D_1 \ldots D_m$. Therefore, the comparators $CP_1$-$CP_{2m}$ compare the analog input voltage $V_{in}$ with the reference voltages $V_{ref}$ generated by the voltage divider and the encoder ROM 10 produces corresponding digital signals $D_1 \ldots D_m$ based upon these comparisons. As shown in FIG. 1, generally there are numerous comparators $CP_1, CP_2, \ldots CP_{2m}$, and thus, numerous comparator units 5 are needed for a conventional flash A/D converter.

FIG. 2 (PRIOR ART) shows a circuit diagram of a conventional comparator unit 5 comprising clock driven transistor $Q_{12}$ and $Q_{13}$, transistors $Q_1$-$Q_3$, $Q_{10}$ and $Q_{11}$, latch transistor $Q_8$ and $Q_9$, and resistors $R_1$-$R_3$ and $R_5$.

When clock CK goes high, transistor $Q_{13}$ turns on. If analog input voltage $V_{in}$ is higher than reference voltage $V_{ref}$, a larger portion of current $I_2$ flows through transistor $Q_{10}$ than transistor $Q_{11}$, thereby producing a larger voltage drop across resistor $R_2$ than resistor $R_3$. Accordingly, the voltage at the collector of transistor $Q_{10}$ is lower than the voltage at the collector of transistor $Q_{11}$. Since the voltage drop across resistor $R_3$ is small (i.e., current $I_2$ is smaller along the transistor $Q_{11}$ side of the comparator), likewise the voltage drop across $R_1$ is small because current $I_2$ is small (VB1 is high, thus transistor $Q_2$ is on). Thus, with a small current $I_2$ at the collector of transistor $Q_2$ (or enable terminal $E_{n+1}$, which does not have current flowing from adjacent comparator $CP_{i+1}$ along its corresponding transistor $Q_1$ and enable terminal $E_{n-1}$), output voltage $V_{out}$ at the emitter of transistor $Q_3$ is a high level of $V_{CC}$-$V_{BE}(Q_3)$.

On the other hand, if analog input voltage $V_{in}$ is lower than reference voltage $V_{ref}$, a larger portion of current $I_2$ flows through transistor $Q_{11}$ than transistor $Q_{10}$, thereby producing a larger voltage drop across resistor $R_3$ than resistor $R_2$. Accordingly, the voltage at the collector of transistor $Q_{10}$ is higher than the voltage at the collector of transistor $Q_{11}$. Since the voltage drop across resistor $R_3$ is large (i.e., current $I_2$ is larger along the transistor $Q_{11}$ side of the comparator), likewise the voltage drop across $R_1$ is larger because current $I_2$ is larger (VB1 is high, thus transistor $Q_2$ is on). Thus, with a larger current $I_2$ at the collector of transistor $Q_2$ (or enable terminal $E_{n+1}$), output voltage $V_{out}$ at the emitter of transistor $Q_3$ is a low level of $V_{CC}$-$I_2 \times R_1$-$V_{BE}(Q_3)$.

When CK goes high, transistor $Q_{12}$ turns on thereby allowing current $I_2$ to flow through latch transistors $Q_8$ and $Q_9$. Since the collector voltages of transistors $Q_{10}$ and $Q_{11}$ are connected to the bases of latch transistors $Q_8$ and $Q_9$, during latching the collector voltages of transistors $Q_8$-$Q_{11}$ maintain their pre-state voltages, thus maintaining the voltage difference between the collectors of latch transistors $Q_8$ and $Q_9$. If analog input voltage $V_{in}$ is larger than reference voltage $V_{ref}$, current $I_2$ flows through transistor $Q_{12}$, latch transistor $Q_9$, resistor $R_2$, and transistor $Q_1$ to enable terminal $E_{n-1}$ and decreases the collector voltage of latch transistor $Q_9$ by $I_2 \times R_2$ lower than latch transistor $Q_8$. On the other hand, if analog input voltage $V_{in}$ is smaller than reference voltage $V_{ref}$, current $I_2$ flows through transistor $Q_{12}$, latch transistor $Q_8$, resistor $R_3$, and transistor $Q_2$ and decreases the collector voltage of latch transistor $Q_8$ by $I_2 \times R_3$ lower than latch transistor $Q_8$.

By this latching operation, when analog input voltage $V_{in}$ is larger than reference voltage $V_{ref}$ of comparator $CP_i$ and smaller than reference voltage $V_{ref}$ of comparator $CP_{i+1}$, only comparator $CP_i$ provides a high level output voltage $V_{out}$ while the other comparators produce low level output voltages.

However, in a conventional comparator unit, resistors $R_2$ and $R_3$ are connected between the emitters of transistors $Q_1$ and $Q_2$ and the collectors of latch transistors $Q_8$ and $Q_9$ causing a loop (for examples, the loop for latch transistor $Q_9$ comprises the collector of latch transistor $Q_9$, resistor $R_2$, the emitter of transistor $Q_1$, the bases of transistors $Q_1$ and $Q_2$, the emitter of transistor $Q_2$, resistor $R_3$, the base of latch transistor $Q_9$) to have a gain which increases the miller-capacitance between the collectors and bases of latch transistor $Q_8$ and $Q_9$, thus lowering the speed of the comparator unit 5.

SUMMARY OF THE INVENTION

The object of the present invention is to provide a comparator unit for a flash A/D converter comprising a miller-effect reducer which can reduce the miller-effect of a latch transistor to increase the comparison speed.

Accordingly, a comparator unit of the present invention comprises clock driven transistors, transistors for comparing analog input voltages with references voltages, latch transistor configuration, and a cascode transistor configuration. The cascode transistor configuration is connected to the latch transistor configuration and operates to reduce a miller-capacitance effect to increase the comparison speed.

BRIEF DESCRIPTION OF THE DRAWINGS

The novel features believed characteristic of the invention are set forth in the appended claims. The present invention itself, however, as well as other features and advantages thereof, will best be understood by reference to the following detailed description of the preferred embodiment, read in conjunction with the accompanying drawings, wherein:

DETAILED DESCRIPTION OF THE PREFERRED EMBODIMENT

Figure 2:
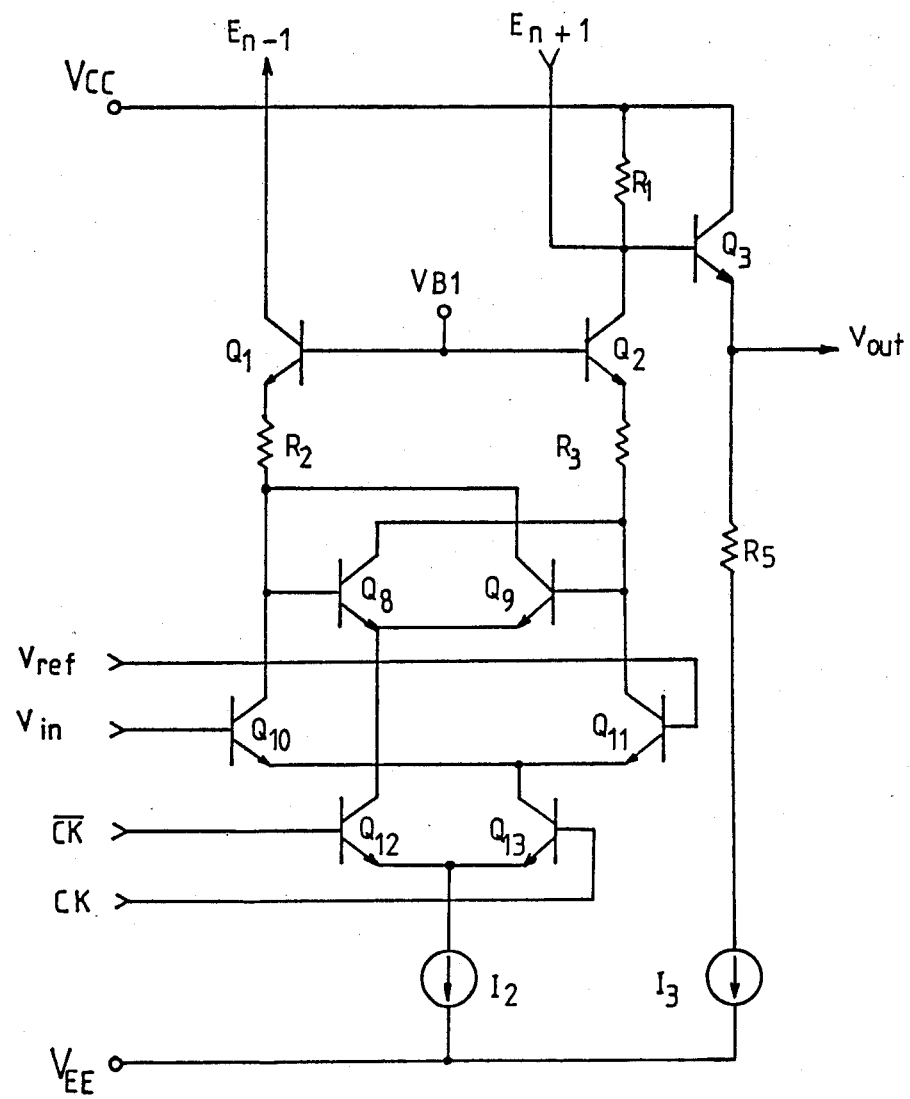
FIG. 2 is a circuit diagram of a conventional comparator unit of a flash A/D converter.
Figure 3:
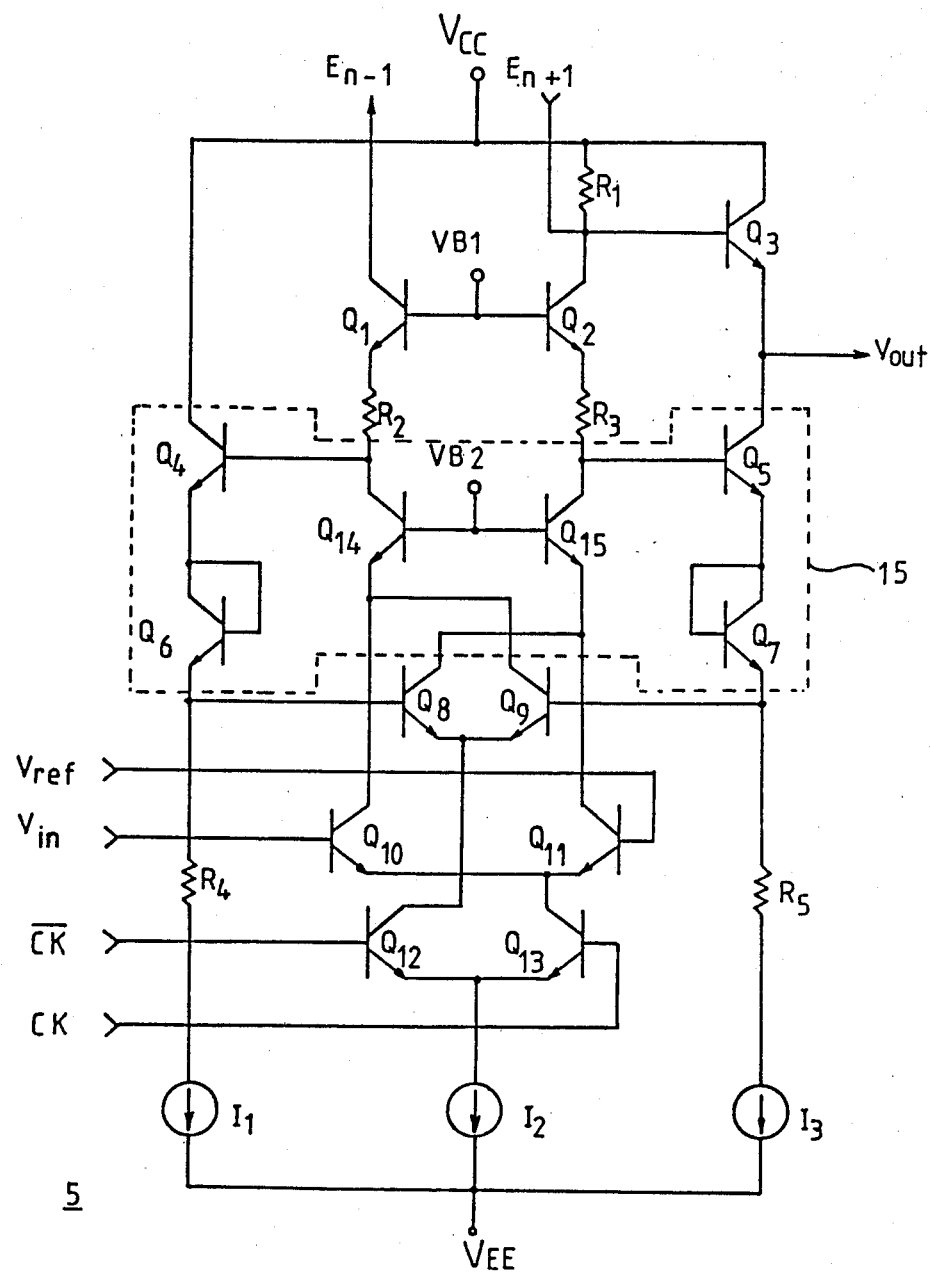
FIG. 3 is a circuit diagram of a comparator unit for a flash A/D converter according to the present invention.

Like elements appearing in FIGS. 2 and 3 are designated with like reference numerals.

As shown in FIG. 3, a comparator unit 5 of the present invention comprises clock driven transistors $Q_{12}$ and $Q_{13}$, transistors $Q_{1-3}$, $Q_{10}$ and $Q_{11}$, latch transistors $Q_8$ and $Q_9$, and resistors $R_1$–$R_3$ and $R_5$ according to a conventional comparator unit and further comprises miller-effect reducer 15 coupled between latch transistors $Q_8$ and $Q_9$ and resistors $R_2$ and $R_3$, and resistor $R_4$.

Figure 1:
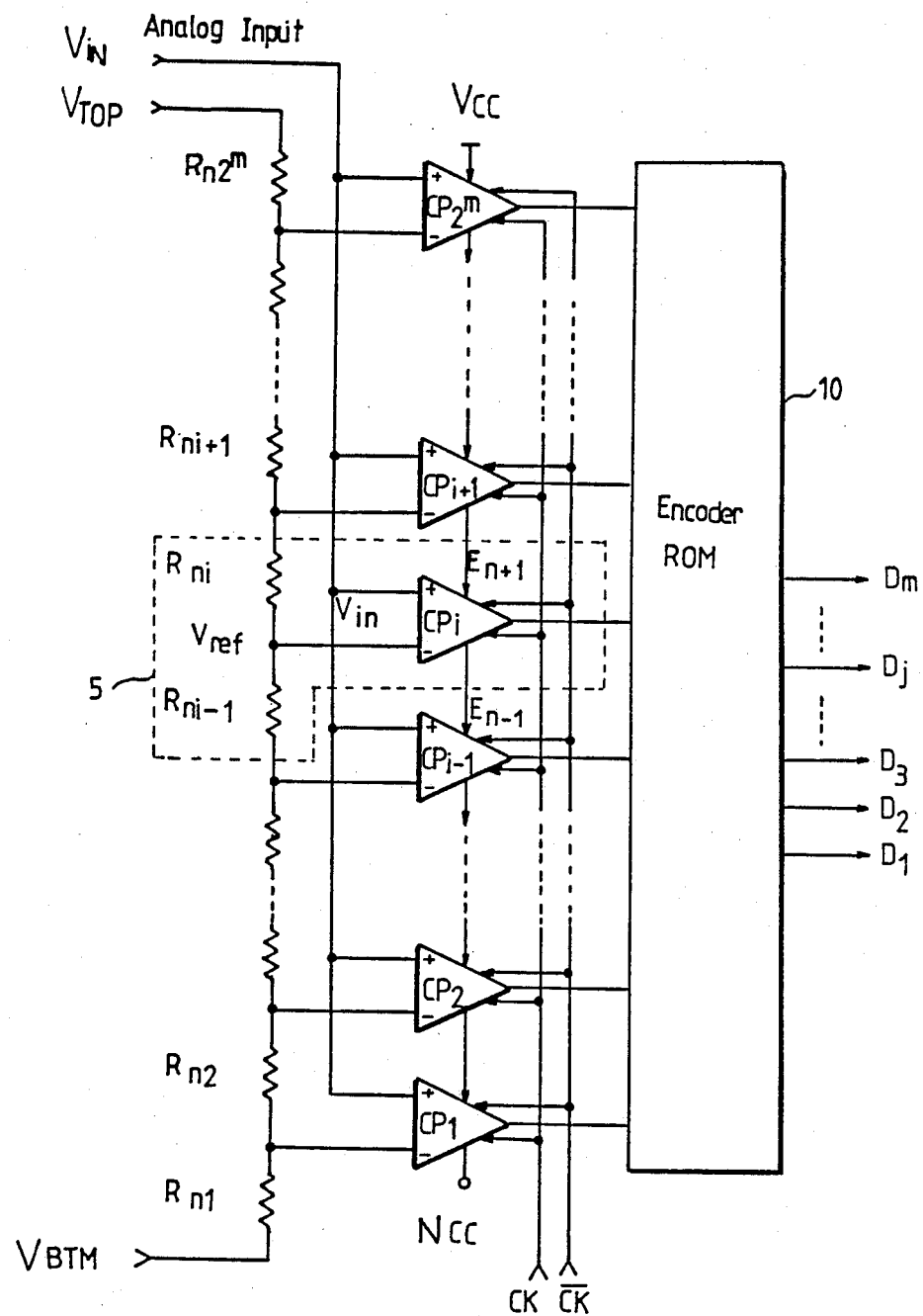
FIG. 1 is a circuit diagram of a conventional flash A/D converter.

Two cascode transistors $Q_{14}$ and $Q_{15}$ are connected between resistor $R_2$ and the collector of latch transistor $Q_9$ and between resistor $R_3$ and the collector of latch transistor $Q_8$, respectively. Positive feed back signals from the collectors of transistors $Q_{14}$ and $Q_{15}$ are supplied to the bases of latch transistors $Q_8$ and $Q_9$ through a level shifter transistor configuration of transistors $Q_4$, $Q_6$ and $Q_5$, $Q_7$, respectively. The remaining structure and elements correspond to those previously described in FIGS. 1 and 2.

When clock CK goes high, the comparator compares analog input voltage $V_{in}$ with the reference voltage $V_{ref}$. When analog input voltage $V_{in}$ is larger than reference voltage $V_{ref}$ a larger portion of current $I_2$ flows through transistor $Q_{10}$ than transistor $Q_{11}$. The current flowing through transistor $Q_{10}$ flows through transistor $Q_{14}$, resistor $R_2$, and transistor $Q_1$ from $E_{n-1}$, while the current flowing through transistor $Q_{11}$ flows through transistor $Q_{15}$, resistor $R_3$, transistor $Q_2$, and resistor $R_1$ from $V_{CC}$. Since current $I_2$ is larger in transistors $Q_{10}$, $Q_{14}$ than transistors $Q_{11}$, $Q_{15}$, the collector voltage of transistor $Q_{14}$ is lower than the collector voltage of transistor $Q_{15}$. These collector voltages propagate to the emitter voltages of transistor $Q_6$ (base voltage of transistor $Q_8$) and transistor $Q_7$ (base voltage of transistor $Q_9$) via level shifter transistors $Q_4$, $Q_6$ and $Q_5$, $Q_7$, respectively. Accordingly, the emitter voltage of transistor $Q_6$ is lower than transistor $Q_7$. The remaining operation of transistor $Q_1$–$Q_3$ and derivation of voltage $V_{out}$ is the same as described in FIG. 2.

Similarly, when the analog input voltage $V_{in}$ is smaller than reference voltage $V_{ref}$, a larger portion of current $I_2$ flows through transistor $Q_{11}$ than transistor $Q_{10}$. Therefore, the collector voltage of transistor $Q_{14}$ is higher than the collector voltage of transistor $Q_{15}$ and the emitter voltage of transistor $Q_6$ (base voltage of transistor $Q_8$) is higher than that of transistor $Q_7$ (base voltage of transistor $Q_9$).

When clock CK goes high (i.e. latching begins), current $I_2$ flows through transistor $Q_{12}$ thereby turning on transistors $Q_8$ and $Q_9$. If in the prelatch state condition analog input voltage $V_{in}$ is larger than reference voltage $V_{ref}$ (base voltage of transistor $Q_8$ is lower than that of transistor $Q_9$), the voltage difference between these voltages is amplified along positive feed back loop $Q_8$ - $Q_{15}$ - $R_3$ - $Q_5$ - $Q_7$ - $Q_9$ - $Q_{14}$ - $R_2$ - $Q_4$ - $Q_6$. Current $I_2$ flows through transistor $Q_{12}$, transistor $Q_9$, transistor $Q_{14}$, resistor $R_2$, and transistor $Q_1$ so that the base voltage of transistor $Q_8$ is lower than that of transistor $Q_9$ by $I_2 \times R_2$.

On the other hand, if the pre-state condition is such that analog input voltage $V_{in}$ is smaller than reference voltage $V_{ref}$ (base voltage of transistor $Q_8$ is higher than that of transistor $Q_9$), the voltage difference between these voltages is amplified along positive feed back loop $Q_8$ - $Q_{15}$ - $R_3$ - $Q_5$ - $Q_7$ - $Q_9$ - $Q_{14}$ - $R_2$ - $Q_4$ - $Q_6$. Current $I_2$ flows through transistor $Q_{12}$, transistor $Q_8$, transistor $Q_{15}$, resistor $R_3$, transistor $Q_2$, and resistor $R_1$ from $V_{CC}$ so that the base voltage of transistor $Q_8$ is higher than that of transistor $Q_9$ by $I_2 \times R_3$.

According to the present invention, a miller-effect reducer 15 has a level shifter transistor configuration and a two-stage cascode transistor configuration. Transistors $Q_1$, $Q_2$ and $Q_{14}$, $Q_{15}$ are connected in a two-stage cascode arrangement and constant voltage VB2 is applied to the bases of transistors $Q_{14}$ and $Q_{15}$. Further, the base of transistors $Q_8$ and $Q_9$ are connected to emitters $Q_6$ and $Q_7$, respectively (rather than the base of transistor $Q_8$ being connected to the collector of transistor $Q_9$ and vice versa).

The level shifter transistor configuration $Q_4$–$Q_7$ lowers the base voltages of transistors $Q_8$ and $Q_9$. As a result, transistors $Q_8$ and $Q_9$ are prevented from saturation because the collector voltages of transistors $Q_{14}$ and $Q_{15}$ are higher than those of transistors $Q_8$ and $Q_9$. Thus, amplified signals along resistors $R_2$ or $R_3$ propagate through level shifter transistors $Q_4$, $Q_6$ or $Q_5$, $Q_7$, respectively, thereby reducing the miller-capacitance effect and enhancing the speed of the comparator unit 5.

The present invention is advantageous over conventional comparator units in that a one-stage cascode transistor configuration $Q_1$ and $Q_2$ connected to latch transistors $Q_8$ and $Q_9$ through resistors $R_2$ and $R_3$ (FIG. 2) cannot reduce the miller-capacitance of latch transistors $Q_8$ and $Q_9$. However, in the present invention, a second cascode stage transistors $Q_{14}$ and $Q_{15}$ is placed between resistors $R_2$ and $R_3$ and latch transistors $Q_8$ and $Q_9$ wherein a positive feed back loop from the collectors of transistors $Q_{14}$ and $Q_{15}$ contains the level shifter transistor configuration. This second cascode stage and the positive feed back loop effectively reduce the miller-capacitance effect and the conversion speed of the flash A/D converter can be enhanced through the enhancement of the speed of the comparator unit 5.

What is claimed is:

1. A comparator unit for a flash A/D converter having a plurality of comparator units and an encoder ROM, each said comparator unit comprising:

switching transistors which switch conductive states based upon a clock input signal;

comparing transistors having a single output for comparing an input voltage to a reference voltage, said comparing transistors having their output connected to one of said switching transistors;

latching transistors for latching the output voltage of the comparing transistors, said latching transistors being connected to said comparing transistors and said switching transistors and latch based upon the input clock signal;

miller-capacitance reducing means for reducing a miller capacitance effect of said latching transistors, said miller effect reducing means comprising a pair of transistors having a constant d.c. power input and whose output is connected to said latching transistors and said comparing transistors;

first and second signal transistors being connected to said miller-capacitance reducing means and said latching transistors for generating a signal to an output means; and said output means outputting said compared output voltage to an encoder ROM based upon the comparison of the input voltage and the reference voltage.

2. The comparator unit according to claim 1 wherein said miller-capacitance reducing means comprises level shifting means coupled between said latching transsstors and said first and second signal transistors.

3. The comparator unit of claim 2 wherein said level shifting means comprises a pair of transistors in cascade arrangement connected between the first signal transistor and a latch transistor and a pair of transistors in cascade arrangement connected between the second signal transistor and a latch transistor.

4. A comparator unit for a flash A/D converter comprising:

a first switch transistor having a base connected to a clock signal, a collector, and an emitter;

a second switch transistor having a base connected to an inverted clock signal, a collector, and an emitter;

a pair of comparing transistors having their bases connected to voltage signals to be compared, collectors, and emitters connected to the collector of said first switch transistor;

a first latch transistor having a base, a collector connected to the collector of one of said comparing transistors, and an emitter connected to the collector of said second switch transistor;

a second latch transistor having a base, a collector connected to the collector of another of said comparing transistors, and an emitter connected to the collector of said second switch transistor;

a first resistor and a second resistor each having a first terminal and a second terminal;

a first signal transistor having a base connected to a first voltage source, a collector connected to an enable line of a first adjacent comparator unit, and an emitter connected to a second terminal of said first resistor;

a second signal transistor having a base connected to the first voltage source, a collector connected to an enable line of a second adjacent comparator unit, and an emitter connected to a second terminal of said second resistor;

a third resistor having a first terminal connected to the collector of said second signal transistor and a second termial connected to a voltage supply;

a third signal transistor having a base connected to the collector of said second signal transistor, a collector connected to the voltage supply, and an emitter connected to an output; and a miller-capacitance reducer, having a plurality of transistors, each of the transistors being connected to at least one of the collectors of said comparing transistors, the base of said first and second latch transistors, and the first terminal of said first and second resistors.

5. A comparator unit according to claim 4 wherein said miller-capacitance reducer comprises:

a pair of cascode transistors having their bases connected to a second power source, their collectors connected to the second terminals of said first and second resistors, and their emitters connected to the collectors of one of said pair of comparing transistors and to one of said first and second latch transistors; and level shifting transistors coupled between the collector of one of said pair of cascode transistors and the bases of said first latch transistor and said second latch transistor.

6. A comparator unit according to claim 5 wherein said second level transistors function as one of a resistor and a diode.

7. A comparator unit according to claim 4 wherein said level shifting transistors comprise two pairs of transistors, a first pair coupled between one of said cascode transistors and the base of said first latch transistor, and a second pair coupled between another of said cascode transistors and the base of said second latch transistor, each pair comprising:

a first level transistor connected to the respective collector of said cascode transistors; and a second level transistor connected to said first level transistor and the respective bases of said first latch transistor and said second latch transistor.

* * * * *

UNITED STATES PATENT AND TRADEMARK OFFICE
CERTIFICATE OF CORRECTION

PATENT NO. : 4,910,518

DATED : March 20, 1990

INVENTOR(S) : Heung-Suck Kim, Chan-Kyu Myung

It is certified that error appears in the above-identified patent and that said Letters Patent is hereby corrected as shown below:

On the title page:

Please Change:

"(73) Assignee: Samsun Semiconductor and . . . "  to

--(73) Assignee: Samsung Semiconductor and . . . --

Signed and Sealed this

Thirteenth Day of August, 1991

*Attest:*

HARRY F. MANBECK, JR.

*Attesting Officer*  *Commissioner of Patents and Trademarks*